United States Patent
Liao (10) Patent No.: US 12,093,480 B2
(45) Date of Patent: Sep. 17, 2024

(54) LIGHTING TOUCHPAD WITH DIFFERENT LAYER CONFIGURATION OF SENSING ELECTRODES AND LED CHIPS

(71) Applicant: PIXART IMAGING INC., Hsin-Chu (TW)

(72) Inventor: Chi-Chieh Liao, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 18/140,890

(22) Filed: Apr. 28, 2023

(65) Prior Publication Data

US 2023/0259228 A1 Aug. 17, 2023

Related U.S. Application Data

(62) Division of application No. 17/401,858, filed on Aug. 13, 2021, now Pat. No. 11,687,187.

(30) Foreign Application Priority Data

Apr. 9, 2021 (CN) .......................... 202110382812.7

(51) Int. Cl.
G06F 3/041 (2006.01)
G06F 3/044 (2006.01)
H01L 25/075 (2006.01)

(52) U.S. Cl.
CPC .......... *G06F 3/0416* (2013.01); *G06F 3/0445* (2019.05); *H01L 25/0753* (2013.01)

(58) Field of Classification Search
CPC ... G06F 3/0416; G06F 3/0445; H01L 25/0753
See application file for complete search history.

(56) References Cited

U.S. PATENT DOCUMENTS

| | | |
|---|---|---|
| 2017/0269749 A1 | 9/2017 | Bok et al. |
| 2018/0059858 A1* | 3/2018 | Tsai ..................... G06F 3/0446 |
| 2020/0051958 A1 | 2/2020 | Hu |

(Continued)

FOREIGN PATENT DOCUMENTS

CN 110362221 A 10/2019

OTHER PUBLICATIONS

USPTO, Office Action issued on Mar. 18, 2024 for U.S. Appl. No. 17/897,722.

*Primary Examiner* — Liliana Cerullo
(74) *Attorney, Agent, or Firm* — Li & Cai Intellectual Property (USA) Office (57) ABSTRACT

A lighting touchpad is provided, which includes a substrate module, a plurality of sensing electrodes, a plurality of driving electrodes, a plurality of light emitting diode (LED) chips mounted on the substrate module, and a controller. The driving electrodes and the sensing electrodes are formed on the substrate module. The driving electrodes define a distribution space that extends along a normal direction of the substrate module. The LED dies are arranged in the distribution space. The controller is electrically coupled to the sensing electrodes, the driving electrodes, and the LED dies through the substrate module. When a coupling capacity is generated between a conductor and at least one of the sensing electrodes, the controller is configured to drive at least one of the LED dies adjacent to the at least one of the sensing electrodes to emit light.

6 Claims, 9 Drawing Sheets

(56) References Cited

U.S. PATENT DOCUMENTS

| | | |
|---|---|---|
| 2020/0343314 A1 | 10/2020 | Nakamura et al. |
| 2021/0109617 A1 | 4/2021 | Lin et al. |
| 2021/0175282 A1* | 6/2021 | Ikeda .................... G06F 3/0445 |

* cited by examiner

LIGHTING TOUCHPAD WITH DIFFERENT LAYER CONFIGURATION OF SENSING ELECTRODES AND LED CHIPS

CROSS-REFERENCE TO RELATED PATENT APPLICATION

This application claims the benefit of priority to China Patent Application No. 202110382812.7, filed on Apr. 9, 2021 in People's Republic of China. The entire content of the above identified application is incorporated herein by reference.

This application is a divisional application of U.S. application Ser. No. 17/401,858, filed Aug. 13, 2021, entitled "LIGHTING TOUCHPAD", now pending, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a touch panel, and more particularly to a lighting touchpad.

BACKGROUND OF THE DISCLOSURE

A conventional lighting touchpad includes a plurality of light emitting diode (LED) chips arranged on lateral portions thereof and a light guiding board that is in cooperation with the LED dies for guiding lights emitted from the LED dies. However, a touch control effect of the lateral portions of the conventional lighting touchpad can be affected by an arrangement of the LED dies.

SUMMARY OF THE DISCLOSURE

In response to the above-referenced technical inadequacy, the present disclosure provides a lighting touchpad to effectively improve on the issues associated with conventional lighting touchpads.

In one aspect, the present disclosure provides a lighting touchpad, which includes a substrate module, a sensing electrode layer, a driving electrode layer, a plurality of light emitting diode (LED) chips, and a controller. The substrate module defines a normal direction. The sensing electrode layer includes a plurality of sensing electrodes formed on the substrate module. The driving electrode layer includes a plurality of driving electrodes formed on the substrate module. The driving electrode layer defines a distribution space extending from the driving electrodes along the normal direction. The LED dies are mounted on the substrate module and are arranged in the distribution space. The LED dies do not shield any one of the sensing electrodes along the normal direction. The controller is electrically coupled to the sensing electrode layer, the driving electrode layer, and the LED dies through the substrate module.

In certain embodiments, the substrate module includes a plurality of substrates arranged along the normal direction, and the sensing electrodes and the LED dies are jointly disposed on one of the substrates that is defined as a first substrate.

In certain embodiments, the lighting touchpad further includes a protective layer. The protective layer covers the sensing electrodes and the LED dies.

In certain embodiments, a distance between the first substrate and a light emitting end surface of any one of the LED dies is greater than a thickness of any one of the sensing electrodes. The protective layer has a plurality of accommodating slots recessed in a surface thereof facing the first substrate, and the light emitting end surfaces of the LED dies are respectively located in the accommodating slots.

In certain embodiments, the protective layer has a manipulation surface arranged away from the substrate module. The manipulation surface and the light emitting end surface of any one of the LED dies are separated from each other by an interval that is greater than 0 and less than 1 mm.

In certain embodiments, the substrate module includes a plurality of first circuits and a plurality of second circuits. The first circuits and the second circuits are electrically coupled to the controller, the first circuits are respectively connected to the LED dies in a one-to-one manner, and the second circuits are respectively connected to the LED dies in a one-to-one manner.

In certain embodiments, the substrate module includes a plurality of first circuits electrically coupled to the controller and a plurality of second circuits that respectively correspond to the first circuits. The LED dies are divided into a plurality of light emitting groups each having at least two of the LED dies. Any one of the first circuits is connected to each of the LED dies of one of the light emitting groups, and any one of the second circuits is connected to one of the LED dies of each of at least two of the light emitting groups.

In certain embodiments, the driving electrodes are disposed on another one of the substrates other than the first substrate.

In certain embodiments, the driving electrode layer and the sensing electrode layer are respectively located at different height positions in the normal direction.

In certain embodiments, when a coupling capacity is generated between a conductor and at least one of the sensing electrodes, the controller is configured to drive at least one of the LED dies adjacent to the at least one of the sensing electrodes to emit light.

In another aspect, the present disclosure provides a lighting touchpad, which includes a substrate module, a sensing electrode layer, a driving electrode layer, a plurality of light emitting diode (LED) chips, and a controller. The substrate module defines a normal direction. The sensing electrode layer includes a plurality of sensing electrodes formed on the substrate module. The driving electrode layer includes a plurality of driving electrodes formed on the substrate module. Each of the driving electrodes is formed to surround a distribution region, and the driving electrode layer defines a distribution space extending from the distribution regions along the normal direction. The LED dies are mounted on the substrate module and are arranged in the distribution space. The LED dies do not shield any one of the sensing electrodes along the normal direction. The controller is electrically coupled to the sensing electrode layer, the driving electrode layer, and the LED dies through the substrate module. When a coupling capacity is generated between a conductor and at least one of the sensing electrodes, the controller is configured to drive at least one of the LED dies adjacent to the at least one of the sensing electrodes to emit light.

In certain embodiments, the substrate module includes a plurality of substrates arranged along the normal direction, and the driving electrodes and the LED dies are jointly disposed on one substrate that is defined as a first substrate. Any one of the LED dies is surrounded by one of the driving electrodes and is located in the distribution region defined by the one of the driving electrodes.

In certain embodiments, the sensing electrodes are disposed on the first substrate, and the lighting touchpad further includes a protective layer. The protective layer covers the sensing electrodes, the driving electrodes, and the LED dies.

In certain embodiments, a distance between the first substrate and a light emitting end surface of any one of the LED dies is greater than a thickness of any one of the sensing electrodes. The protective layer has a plurality of accommodating slots recessed in a surface thereof facing the first substrate, and the light emitting end surfaces of the LED dies are respectively located in the accommodating slots.

In certain embodiments, the protective layer has a manipulation surface arranged away from the substrate module. The manipulation surface and the light emitting end surface of any one of the LED dies are separated from each other by an interval that is greater than 0 and less than 1 mm.

In certain embodiments, the sensing electrodes are disposed on another one of the substrates that is other than the first substrate and that is defined as a second substrate. The second substrate has a plurality of thru-holes in the distribution space, and the light emitting end surface of any one of the LED dies faces toward one of the thru-holes.

In certain embodiments, the substrate module includes a plurality of substrates arranged along the normal direction, the driving electrodes are disposed on one of the substrates that is defined as a first substrate, and the LED dies are disposed on another one of the substrates. The first substrate has a plurality of thru-holes respectively corresponding in position to the distribution regions, and the light emitting end surface of any one of the LED dies faces toward one of the thru-holes.

In certain embodiments, the sensing electrodes are disposed on the first substrate, and the lighting touchpad further includes a protective layer. The protective layer covers the sensing electrodes and the driving electrodes.

In certain embodiments, the substrate module includes a plurality of first circuits and a plurality of second circuits. The first circuits and the second circuits are electrically coupled to the controller, the first circuits are respectively connected to the LED dies in a one-to-one manner, and the second circuits are respectively connected to the LED dies in a one-to-one manner.

In certain embodiments, the substrate module includes a plurality of first circuits electrically coupled to the controller and a plurality of second circuits that respectively correspond to the first circuits. The LED dies are divided into a plurality of light emitting groups each having at least two of the LED dies. Any one of the first circuits is connected to each of the LED dies of one of the light emitting groups, and any one of the second circuits is connected to one of the LED dies of each of at least two of the light emitting groups.

Therefore, through cooperation of the LED dies and other components of the present disclosure (e.g., the LED dies being located in the distribution space and not shielding any one of the sensing electrodes along the normal direction), a touch control effect of the lighting touchpad provided by the present disclosure can avoid being affected by a position of any one of the LED dies, and subtle changes in partial optical performances of the lighting touchpad can be provided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
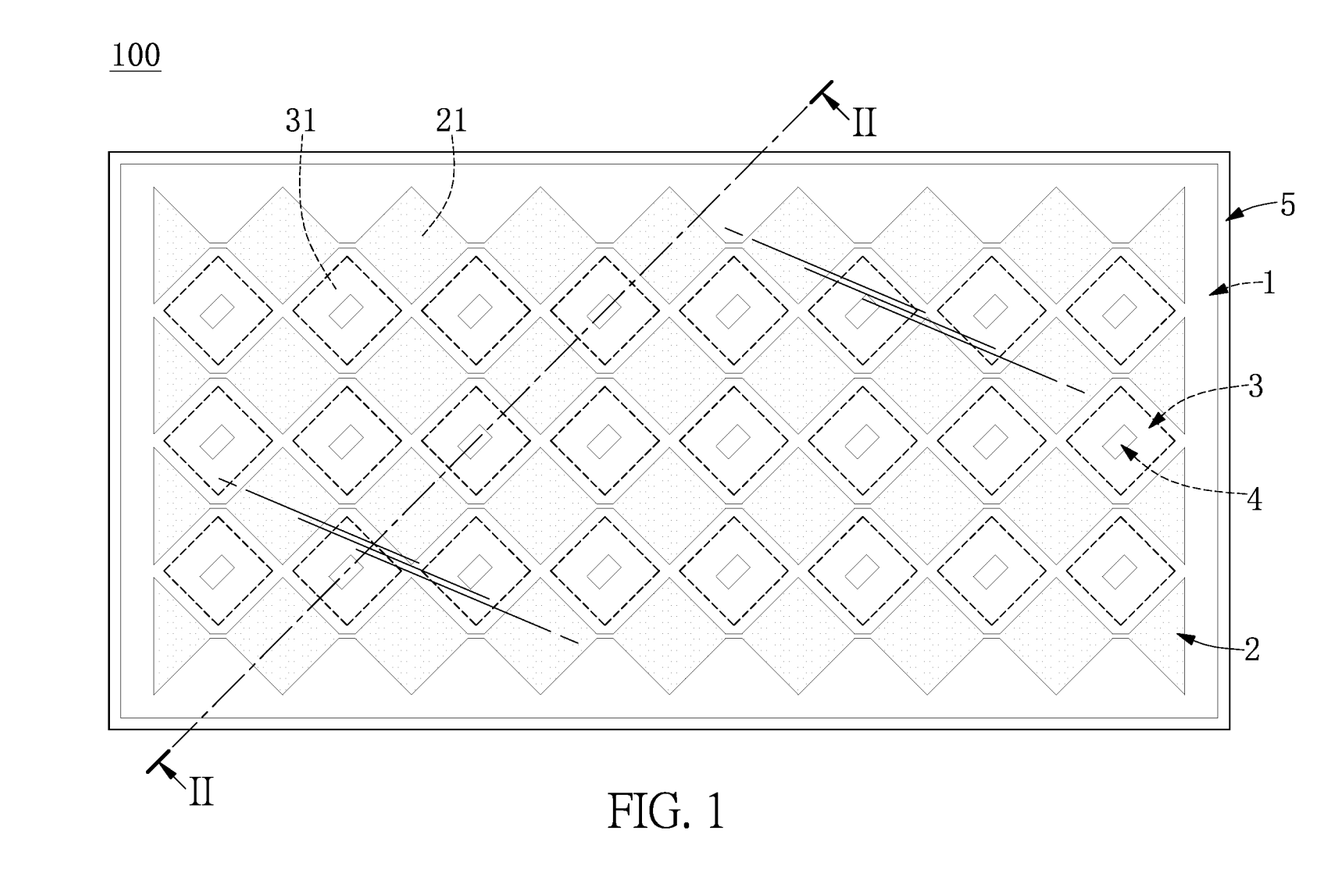
FIG. 1 is a schematic top view of a lighting touchpad according to a first embodiment of the present disclosure.
Figure 2:
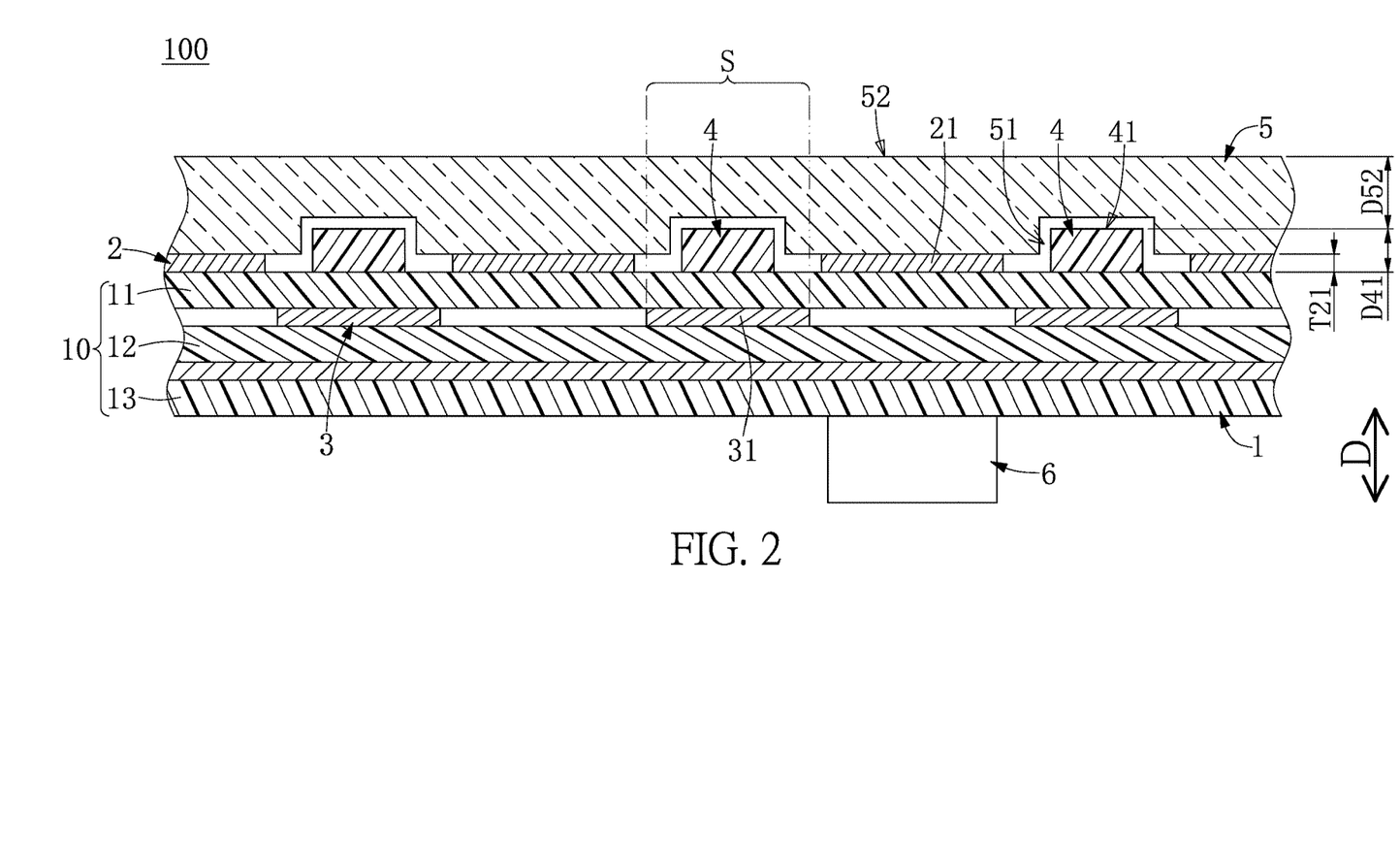
FIG. 2 is a cross-sectional view taken along line II-II of FIG. 1.

Referring to FIG. 1 to FIG. 4, a first embodiment of the present disclosure provides a lighting touchpad 100. As shown in FIG. 1 and FIG. 2, the lighting touchpad 100 includes a substrate module 1, a sensing electrode layer 2, a driving electrode layer 3, a plurality of light emitting diode (LED) chips 4, a protective layer 5, and a controller 6. The sensing electrode layer 2, the driving electrode layer 3, the LED dies 4, and the controller 6 are mounted on the substrate module 1, and the protective layer 5 covers (or is disposed above) the sensing electrode layer 2 and the LED dies 4.

It should be noted that the lighting touchpad 100 in the present embodiment includes the above components, but the present disclosure is not limited thereto. For example, in other embodiments of the present disclosure not shown in the drawings, the protective layer 5 of the lighting touchpad 100 can be omitted or can be replaced by other components. The following description describes the structure and connection relationship of each component of the lighting touchpad 100.

Furthermore, in the lighting touchpad 100 of the present embodiment, the sensing electrode layer 2, the driving electrode layer 3, and the LED dies 4 can be cooperated with each other by structural design thereof, thereby avoiding shielding light and avoiding affecting a touch sensing effect. Accordingly, the lighting touchpad 100 of the present embodiment is different from a conventional touch screen that provides light to pass there-through by forming transparent electrodes.

The substrate module 1 defines a normal direction D, and includes a plurality of substrates 10 arranged along the normal direction D. In other words, any one of the substrates 10 in the present embodiment is perpendicular to the normal direction D. In order to clearly describe the present embodiment, in a direction away from the protective layer 5, the substrates 10 are defined to sequentially include a first substrate 11, a second substrate 12, and a third substrate 13 that are spaced apart from each other, but the present disclosure is not limited thereto. For example, in other embodiments of the present disclosure not shown in the drawings, the substrate module 1 can be provided without the third substrate 13 or can be provided with an additional substrate (e.g., a fourth substrate).

The sensing electrode layer 2 includes a plurality of sensing electrodes 21 formed on the substrate module 1. The sensing electrodes 21 in the present embodiment are spaced apart from each other and are formed on a surface of the first substrate 11 (e.g., a top surface of the first substrate 11 shown in FIG. 2) adjacent to the protective layer 5, but the present disclosure is not limited thereto. For example, in other embodiments of the present disclosure not shown in the drawings, at least one of the sensing electrodes 21 can be formed on another surface of the first substrate 11 (e.g., a bottom surface of the first substrate 11 shown in FIG. 2) away from the protective layer 5.

The driving electrode layer 3 and the sensing electrode layer 2 are respectively located at different height positions in the normal direction D, and the driving electrode layer 3 includes a plurality of driving electrodes 31 formed on the substrate module 1. The driving electrodes 31 are disposed on another one of the substrates 10 other than the first substrate 11. The driving electrodes 31 in the present embodiment are spaced apart from each other and are formed on a surface of the second substrate 12 (e.g., a top surface of the second substrate 12 shown in FIG. 2) adjacent to the first substrate 11, but the present disclosure is not limited thereto.

For example, in other embodiments of the present disclosure not shown in the drawings, at least one of the driving electrodes 31 can be formed on another surface of the second substrate 12 (e.g., a bottom surface of the second substrate 12 shown in FIG. 2) away from the first substrate 11; or, at least one of the driving electrodes 31 can be formed on the another surface of the first substrate 11 (e.g., the bottom surface of the first substrate 11 shown in FIG. 2) away from the protective layer 5.

Specifically, the driving electrode layer 3 defines a distribution space S extending from the driving electrodes 31 along the normal direction D, and the sensing electrodes 21 in the present embodiment are arranged outside of the distribution space S. In other words, a projection region defined by orthogonally projecting the sensing electrodes 21 onto the second substrate 12 surrounds an outer side of the driving electrodes 31, but the present disclosure is not limited thereto. For example, in other embodiments of the present disclosure not shown in the drawings, a peripheral portion of at least one of the sensing electrodes 21 can be located in the distribution space S.

The LED dies 4 and the sensing electrodes 21 are jointly disposed on one of the substrates 10 (e.g., the first substrate 11), the LED dies 4 are located in the distribution space S, and the LED dies 4 do not shield any one of the sensing electrodes 21 along the normal direction D. In other words, any one of the LED dies 4 in the present embodiment corresponds in position to one of the driving electrodes 31 along the normal direction D.

Moreover, a distance D41 between the first substrate 11 and a light emitting end surface 41 of any one of the LED dies 4 (e.g., a top surface of any one of the LED dies 4 shown in FIG. 2) is greater than a thickness T21 of any one of the sensing electrodes 21. Specifically, a difference between the distance D41 and the thickness T21 can be greater than 0 and less than 1 mm, but the present disclosure is not limited thereto.

The protective layer 5 in the present embodiment is a board detachably disposed on the substrate module 1, and the protective layer 5 covers the sensing electrodes 21 and the LED dies 4. The protective layer 5 has a plurality of accommodating slots 51 recessed in a surface thereof (e.g., a bottom surface of the protective layer 5 shown in FIG. 2) facing the substrate module 1 (e.g., the first substrate 11), and the light emitting end surfaces 41 of the LED dies 4 are respectively located in the accommodating slots 51.

Moreover, the protective layer 5 has a manipulation surface 52 (e.g., a top surface of the protective layer 5 shown in FIG. 2) arranged away from the substrate module 1. The manipulation surface 52 and the light emitting end surface 41 of any one of the LED dies 4 are preferably separated from each other by an interval D52 that is greater than 0 and less than 1 mm, but the present disclosure is not limited thereto.

The controller 6 in the present embodiment is mounted on a surface of the third substrate 13 (e.g., a bottom surface of the third substrate 13 shown in FIG. 2) away from the protective layer 5, but the present disclosure is not limited thereto. For example, in other embodiments of the present disclosure not shown in the drawings, the controller 6 can be mounted on any one of the substrates 10 of the substrate module 1, or can be mounted on other components different from the substrate module 1.

Moreover, the controller 6 is electrically coupled to the sensing electrode layer 2, the driving electrode layer 3, and the LED dies 4 through the substrate module 1. When a coupling capacity generated between a conductor (e.g., a stylus or a finger) and at least one of the sensing electrodes 21, the controller 6 is configured to drive at least one of the LED dies 4 adjacent to the at least one of the sensing electrodes 21 to emit light. Specifically, a quantity of the at least one of the LED dies 4 driven by the controller 6 can be adjusted or changed according to design requirements.

Accordingly, through structural cooperation of the LED dies 4 and other components of the present embodiment (e.g., the LED dies 4 being located in the distribution space S and not shielding any one of the sensing electrodes 21 along the normal direction D), a touch control effect of the lighting touchpad 100 in the present embodiment can avoid being affected by a position of any one of the LED dies 4, and subtle changes in partial optical performances of the lighting touchpad can be provided.

It should be noted that an electrical path that electrically connects the substrate module 1, the LED dies 4, and the controller 6 can be adjusted or changed according to design requirements. In order to clearly describe the present embodiment, the following description takes the electrical path shown in FIG. 3 and FIG. 4 as an example, but the present disclosure is not limited thereto.

Figure 3:
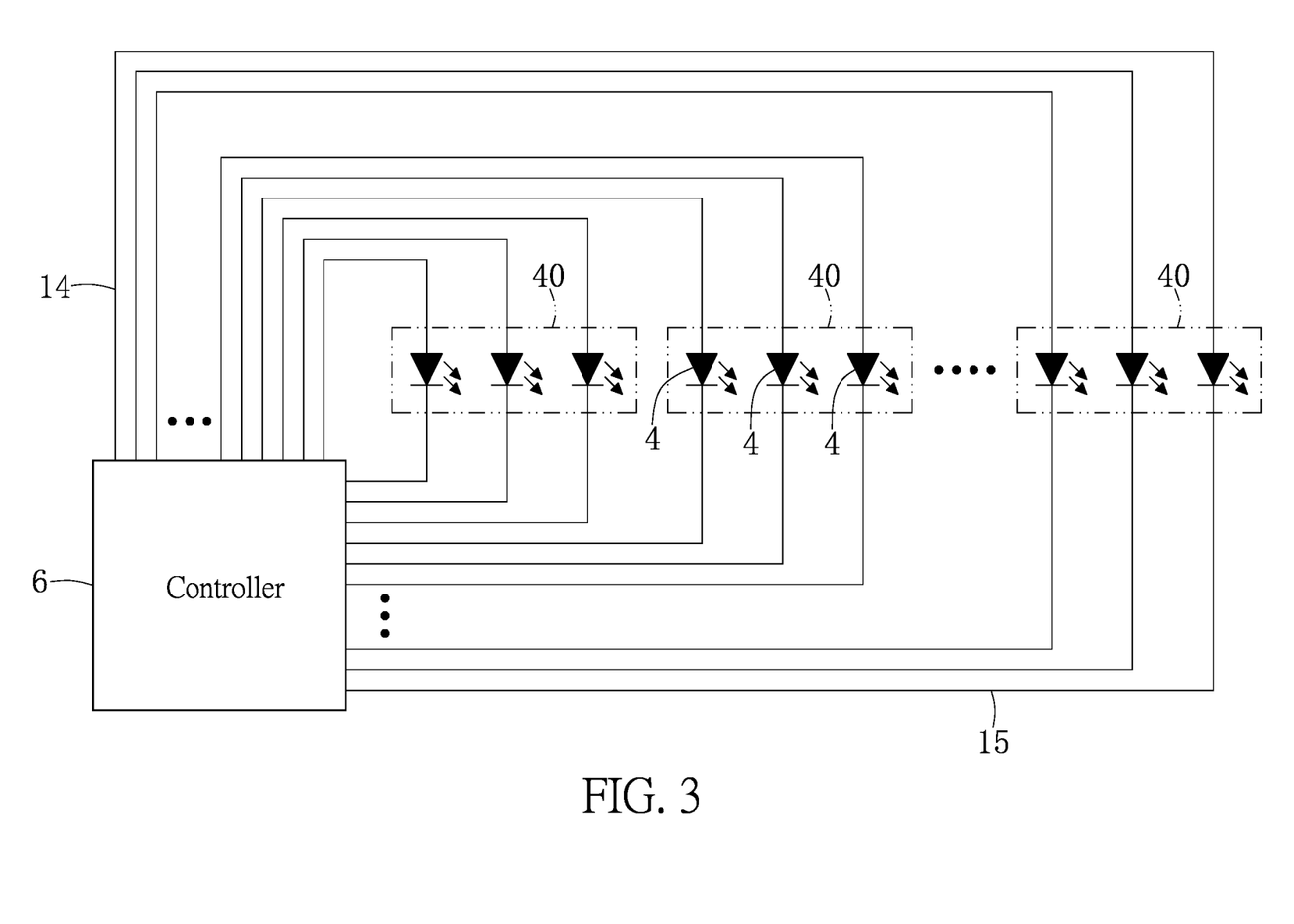
FIG. 3 is a partial circuit diagram of the lighting touchpad according to the first embodiment of the present disclosure.

Specifically, as shown in FIG. 1 to FIG. 3, the substrate module 1 includes a plurality of first circuits 14 and a plurality of second circuits 15. The first circuits 14 and the second circuits 15 are electrically coupled to the controller 6, the first circuits 14 are respectively connected to the LED dies 4 in a one-to-one manner, and the second circuits 15 are respectively connected to the LED dies 4 in a one-to-one manner. Accordingly, each of the LED dies 4 can be independently driven by the controller 6 to emit light.

Figure 4:
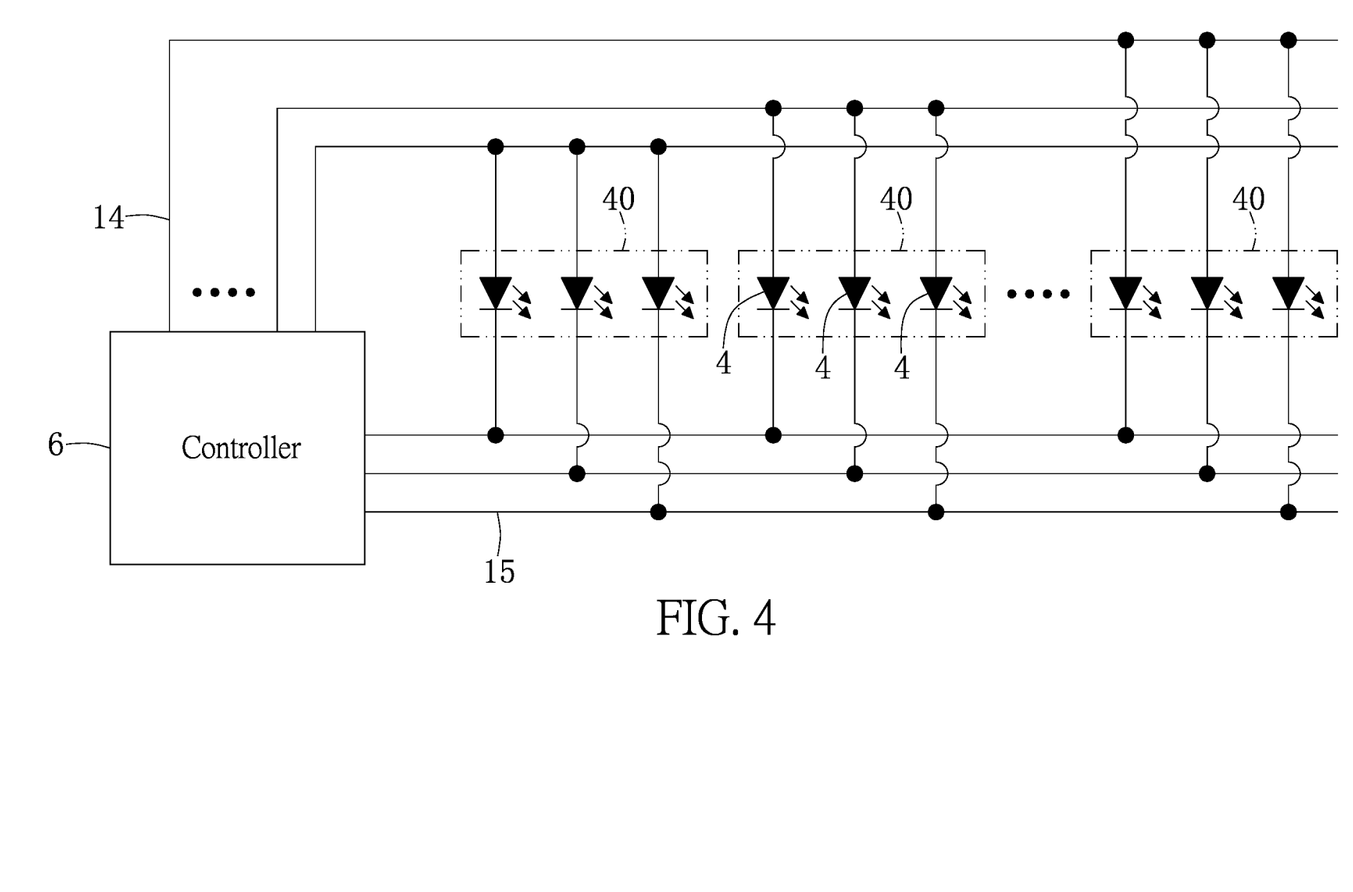
FIG. 4 is a partial circuit diagram of the lighting touchpad in another configuration according to the first embodiment of the present disclosure.

In addition, as shown in FIG. 1, FIG. 2, and FIG. 4, the substrate module 1 can include a plurality of first circuits 14 electrically coupled to the controller 6 and a plurality of second circuits 15 that respectively correspond to the first circuits 14. The LED dies 4 are divided into a plurality of light emitting groups 40 each having at least two of the LED dies 4. Moreover, any one of the first circuits 14 is connected to each of the LED dies 4 of one of the light emitting groups 40, and any one of the second circuits 15 is connected to one of the LED dies 4 of each of at least two of the light emitting groups 40. Accordingly, each of the LED dies 4 can be independently driven by the controller 6 to emit light.

Second Embodiment

Figure 5:
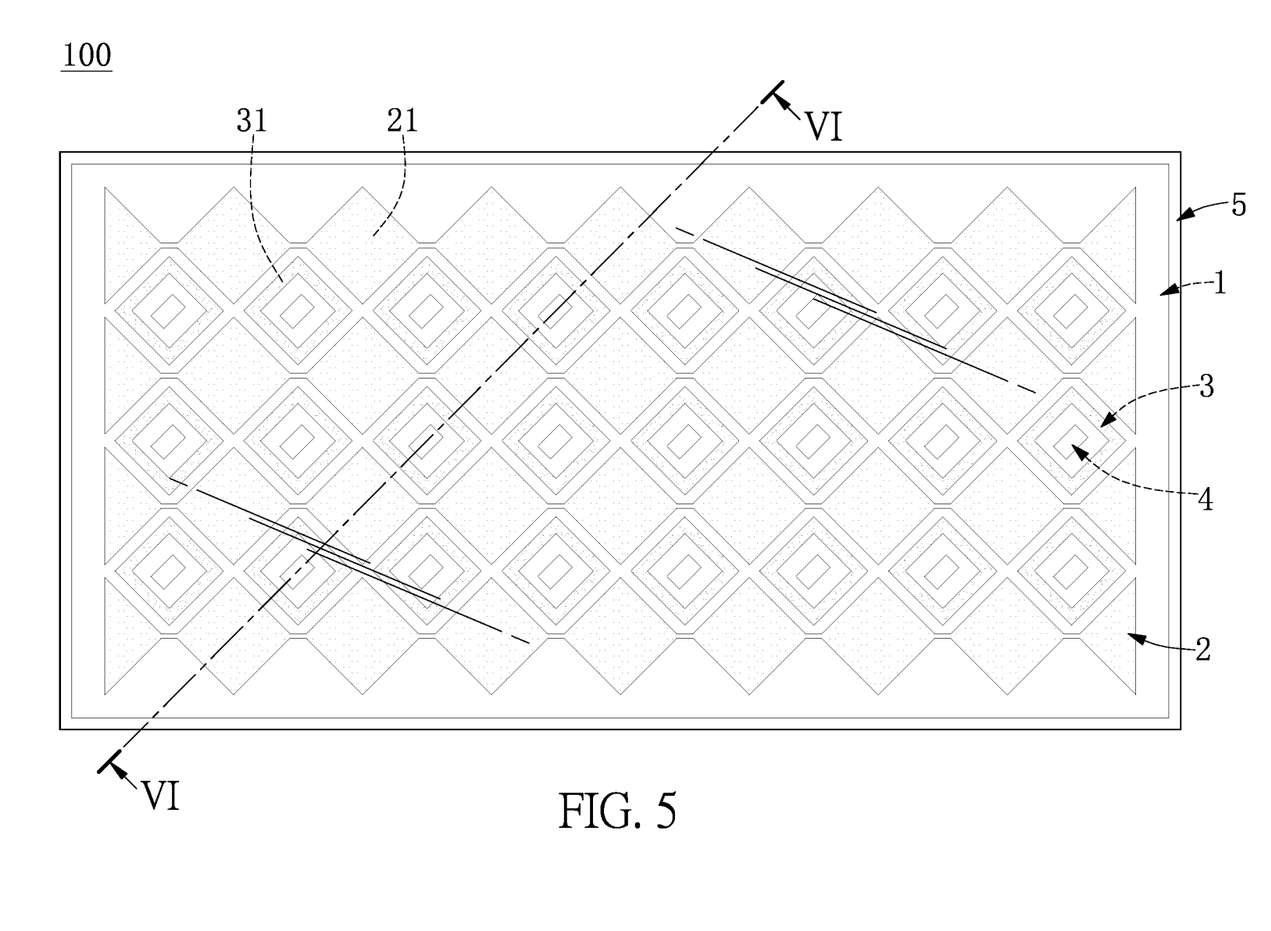
FIG. 5 is a schematic top view of the lighting touchpad according to a second embodiment of the present disclosure.
Figure 6:
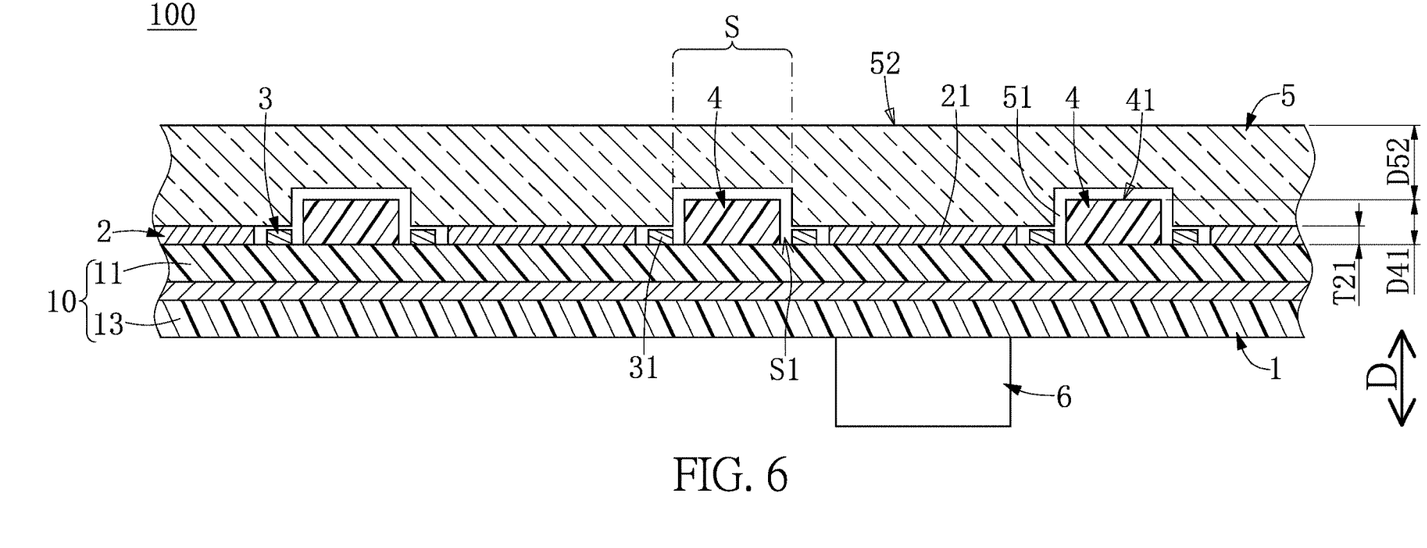
FIG. 6 is a cross-sectional view taken along line VI-VI of FIG. 5.

Referring to FIG. 5 and FIG. 6, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, the sensing electrodes 21, the driving electrodes 31, and the LED dies 4 are jointly disposed on one of the substrates (e.g., the first substrate 11) of the substrate module 1, and the protective layer 5 covers the sensing electrodes 21, the driving electrodes 31, and the LED dies 4. In other words, the substrate module 1 in the present embodiment can be provided without the second substrate 12 disclosed in the first embodiment.

Specifically, each of the driving electrodes 31 is formed to surround one of a plurality of distribution regions S1. In the present embodiment, any one of the driving electrodes 31 is in an annular shape or a U-shape, so that an inner edge of any one of the driving electrodes 31 can surround a corresponding one of the distribution regions S1. For example, any one of the driving electrodes 31 has a thru-hole that is defined as one of the distribution regions S1.

Moreover, the driving electrode layer 3 defines a distribution space S extending from the distribution regions S1 along the normal direction D. The LED dies 4 are arranged in the distribution space S, and do not shield any one of the sensing electrodes 21 along the normal direction D. In other words, any one of the LED dies 4 is surrounded by one of the driving electrodes 31 and is located in the distribution region S1 defined by the one of the driving electrodes 31.

Accordingly, due to the structural design of each of the driving electrodes 31, the sensing electrodes 21, the driving electrodes 31, and the LED dies 4 in the lighting touchpad 100 of the present embodiment can be jointly disposed on the same substrate 10, so that a thickness of the lighting touchpad 100 can be effectively reduced.

Furthermore, the sensing electrodes 21, the driving electrodes 31, and the LED dies 4 of the present embodiment are jointly disposed on the same substrate 10 and are not cooperated with any lateral lighting member, so that the LED dies 4 can be driven directly according to a touch signal generated from the sensing electrodes 21 and the driving electrodes 31. In other words, the LED dies 4 of the present embodiment do not need to be driven after a touch control chip reads a touch signal. Accordingly, the lighting touchpad 100 of the present embodiment can immediately show any touch position by the lighting of the LED dies 4.

Third Embodiment

Figure 7:
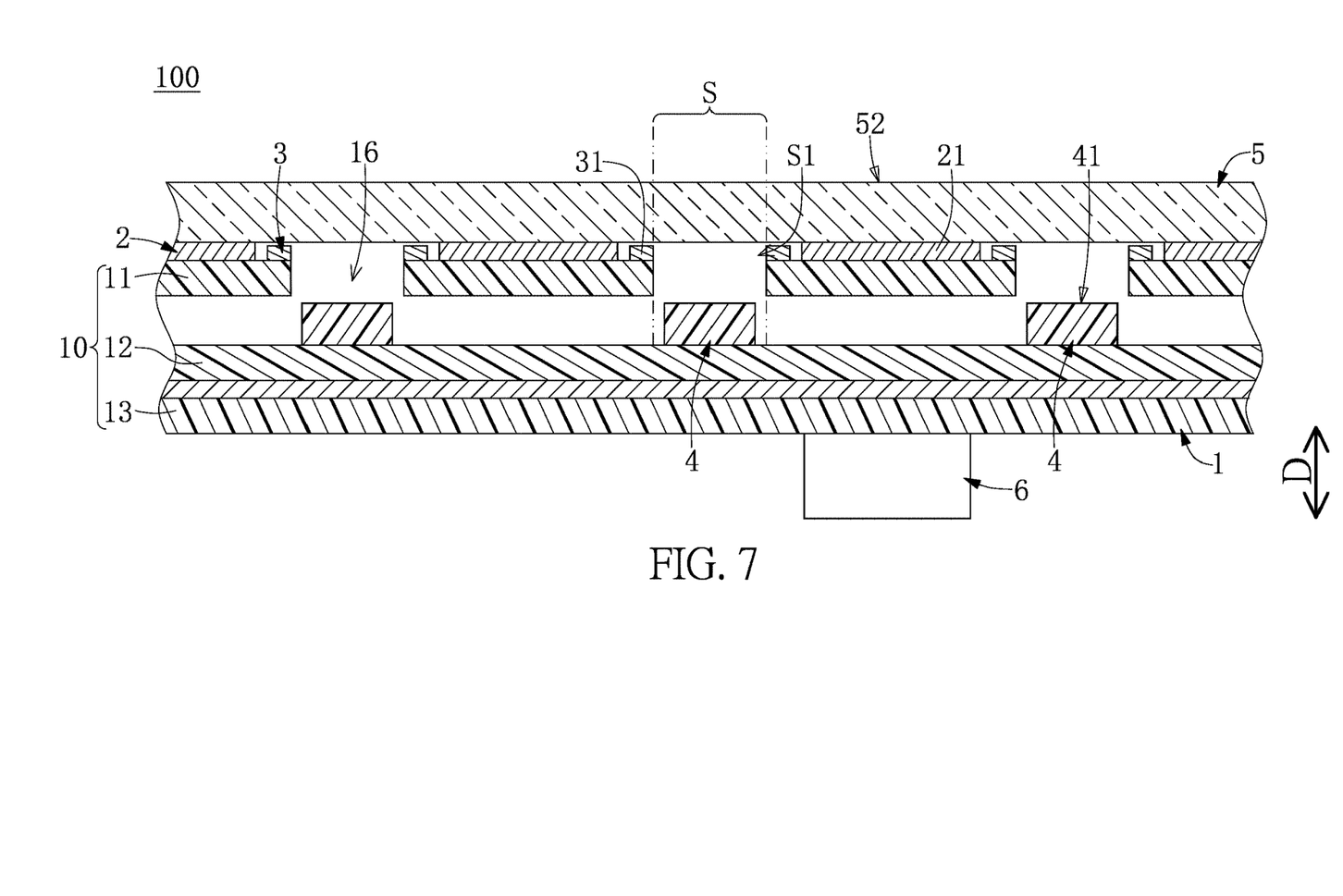
FIG. 7 is a cross-sectional view showing a part of the lighting touchpad according to a third embodiment of the present disclosure.

Referring to FIG. 7, a third embodiment of the present disclosure is similar to the second embodiment of the present disclosure. For the sake of brevity, descriptions of the same components in the second and third embodiments of the present disclosure will be omitted herein, and the following description only discloses different features between the second and third embodiments.

In the present embodiment, the driving electrodes 31 and the sensing electrodes 21 are jointly disposed on one of the substrates 10 of the substrate module 1 (e.g., the first substrate 11), and the LED dies 4 are disposed on another one of the substrates 10 of the substrate module 1 (e.g., the second substrate 12). In other words, the substrate module 1 in the present embodiment can include the second substrate 12 disclosed in the first embodiment.

Specifically, the protective layer 5 covers (or is disposed on) the sensing electrodes 21 and the driving electrodes 31. The first substrate 11 has a plurality of thru-holes 16 respectively corresponding in position to the distribution regions S1, and the light emitting end surface 41 of any one of the LED dies 4 faces toward one of the thru-holes 16. Accordingly, a surface of the protective layer 5 (e.g., a bottom surface of the protective layer 5 shown in FIG. 7) facing the substrate module 1 (e.g., the first substrate 11) can be flat, thereby effectively reducing difficulty of manufacturing the protective layer 5.

Fourth Embodiment

Figure 8:
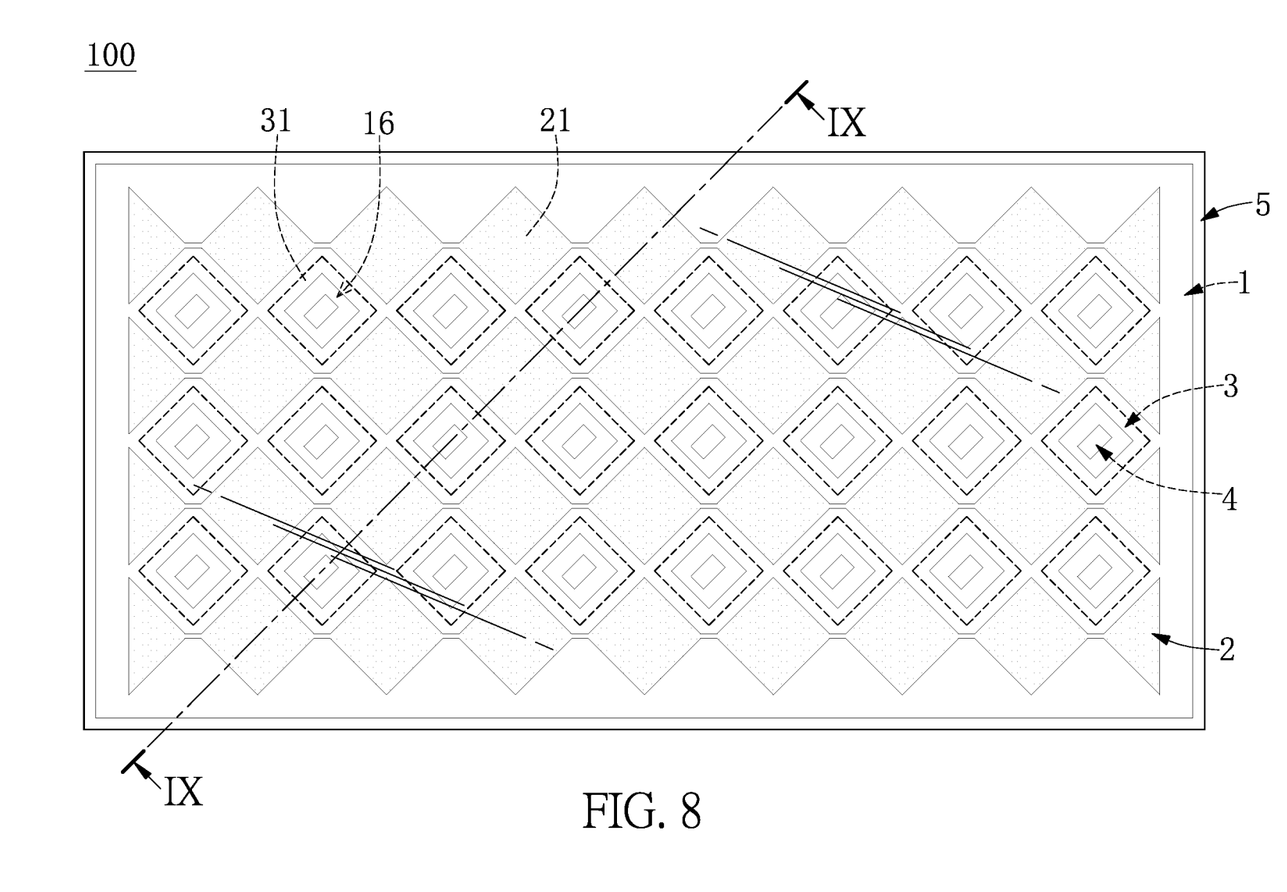
FIG. 8 is a schematic top view of the lighting touchpad according to a fourth embodiment of the present disclosure.
Figure 9:
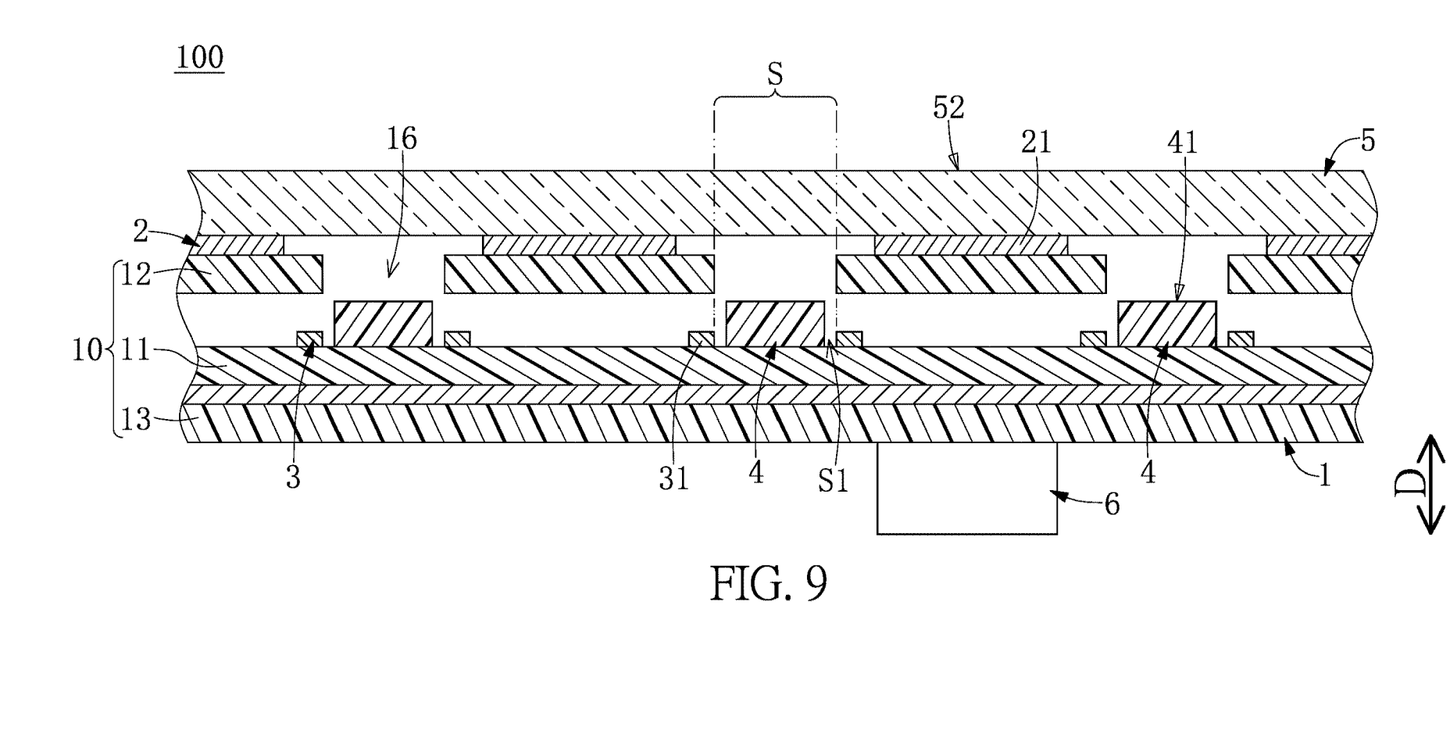
FIG. 9 is a cross-sectional view taken along line IX-IX of FIG. 8.

Referring to FIG. 8 and FIG. 9, a fourth embodiment of the present disclosure is similar to the third embodiment of the present disclosure. For the sake of brevity, descriptions of the same components in the third and fourth embodiments of the present disclosure will be omitted herein, and the following description only discloses different features between the third and fourth embodiments.

In the present embodiment, the substrates 10 arranged in a direction away from the protective layer 5 are spaced apart from each other and are sequentially defined as a second substrate 12, a first substrate 11, and a third substrate 13, but the present disclosure is not limited thereto. Moreover, the driving electrodes 31 and the LED dies 4 are jointly disposed on one of the substrates 10 (e.g., the first substrate 11), and the sensing electrodes 21 are disposed on another one of the substrates 10 (e.g., the second substrate 12) that is other than the first substrate 11.

Specifically, the protective layer 5 covers (or is disposed on) the sensing electrodes 21, the second substrate 12 has a plurality of thru-holes 16 in the distribution space S, and the light emitting end surface 41 of any one of the LED dies 4 faces toward one of the thru-holes 16. Accordingly, a surface of the protective layer 5 (e.g., a bottom surface of the protective layer 5 shown in FIG. 9) facing the substrate module 1 (e.g., the first substrate 11) can be flat, thereby effectively reducing difficulty of manufacturing the protective layer 5.

Beneficial Effects of the Embodiments

In conclusion, through cooperation of the LED dies and other components of the present disclosure (e.g., the LED dies being located in the distribution space and not shielding any one of the sensing electrodes along the normal direction), a touch control effect of the lighting touchpad provided by the present disclosure can avoid being affected by a position of any one of the LED dies, and subtle changes in partial optical performances of the lighting touchpad can be provided.

Moreover, due to the structural design of each of the driving electrodes (e.g., each of the driving electrodes is formed to surround one of a plurality of distribution regions, and the driving electrode layer defines a distribution space that extends from the distribution regions along the normal direction), the sensing electrodes, the driving electrodes, and the LED dies in the lighting touchpad provided by the present disclosure can be jointly disposed on the same substrate, so that a thickness of the lighting touchpad can be effectively reduced.

In addition, the LED dies in the lighting touchpad provided by the present disclosure can be disposed on the substrate away from the protective layer, so that the protective layer does not need to cover any one of the LED dies, thereby effectively reducing a difficulty of manufacturing the protective layer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A lighting touchpad, comprising:
a substrate module defining a normal direction;
a sensing electrode layer including a plurality of sensing electrodes formed on the substrate module;
a driving electrode layer including a plurality of driving electrodes formed on the substrate module, wherein each of the driving electrodes is formed to surround one of a plurality of distribution regions, and the driving electrode layer defines a distribution space that extends from the distribution regions along the normal direction;
a plurality of light emitting diode (LED) chips mounted on the substrate module and arranged in the distribution space, wherein the LED dies do not shield any one of the sensing electrodes along the normal direction; and
a controller electrically coupled to the sensing electrode layer, the driving electrode layer, and the LED dies through the substrate module;
wherein, when a coupling capacity is generated between a conductor and at least one of the sensing electrodes, the controller is configured to drive at least one of the LED dies adjacent to the at least one of the sensing electrodes to emit light;
wherein the substrate module includes a plurality of substrates arranged along the normal direction, and the driving electrodes and the LED dies are jointly disposed on one of the substrates that is defined as a first substrate, and wherein any one of the LED dies is surrounded by one of the driving electrodes and is located in the distribution region defined by the one of the driving electrodes;
wherein the sensing electrodes are disposed on another one of the substrates that is other than the first substrate and that is defined as a second substrate, and wherein the second substrate has a plurality of thru-holes in the distribution space, and the light emitting end surface of any one of the LED dies faces toward one of the thru-holes.

2. The lighting touchpad according to claim 1, wherein the lighting touchpad further includes a protective layer, and wherein the protective layer covers the sensing electrodes, the driving electrodes, and the LED dies.

3. The lighting touchpad according to claim 2, wherein a distance between the first substrate and a light emitting end surface of any one of the LED dies is greater than a thickness of any one of the sensing electrodes, and wherein the protective layer has a plurality of accommodating slots recessed in a surface thereof facing the first substrate, and the light emitting end surfaces of the LED dies are respectively located in the accommodating slots.

4. The lighting touchpad according to claim 3, wherein the protective layer has a manipulation surface arranged away from the substrate module, and wherein the manipulation surface and the light emitting end surface of any one of the LED dies are separated from each other by an interval that is greater than 0 and less than 1 mm.

5. The lighting touchpad according to claim 1, wherein the substrate module includes a plurality of first circuits and a plurality of second circuits, and wherein the first circuits and the second circuits are electrically coupled to the controller, the first circuits are respectively connected to the LED dies in a one-to-one manner, and the second circuits are respectively connected to the LED dies in a one-to-one manner.

6. The lighting touchpad according to claim 1, wherein the substrate module includes a plurality of first circuits that are electrically coupled to the controller and a plurality of second circuits that respectively correspond to the first circuits, wherein the LED dies are divided into a plurality of light emitting groups, each having at least two of the LED dies, and wherein any one of the first circuits is connected to each of the LED dies of one of the light emitting groups, and any one of the second circuits is connected to one of the LED dies of each of at least two of the light emitting groups.

\* \* \* \* \*